United States Patent [19]

Riesenfeld et al.

[11] Patent Number: 4,732,831
[45] Date of Patent: Mar. 22, 1988

[54] XEROPRINTING WITH PHOTOPOLYMER MASTER

[75] Inventors: James Riesenfeld, Basking Ridge, N.J.; William Bindloss, Wilmington, Del.; Graciella Blanchet, Wilmington, Del.; Rolf Dessauer, Wilmington, Del.; Alan S. Dubin, Greenville, Del.

[73] Assignee: E. I. Du Pont de Nemours and Company, Wilmington, Del.

[21] Appl. No.: 56,303

[22] Filed: Jun. 1, 1987

Related U.S. Application Data

[63] Continuation of Ser. No. 858,172, May 1, 1986, abandoned.

[51] Int. Cl.$^4$ ............... G03G 13/14; G03G 13/22; G03G 13/26
[52] U.S. Cl. .................................. 430/49; 430/50; 430/126; 430/119
[58] Field of Search ............. 430/49, 50, 126, 119

[56] References Cited

U.S. PATENT DOCUMENTS

| Re. 29,357 | 8/1977 | Bickmore et al. | 430/97 |
|---|---|---|---|
| Re. 29,537 | 8/1981 | Bickmore | 96/1 R |
| 2,576,047 | 11/1951 | Schaffert | 101/426 |
| 3,113,022 | 12/1963 | Cassiers et al. | 96/1 |
| 3,286,025 | 11/1966 | Ingersoll | 178/6.6 |
| 3,311,471 | 3/1967 | Hepher | 96/1.5 |
| 3,318,698 | 5/1967 | Schwertz | 96/1.1 |
| 3,479,185 | 11/1969 | Chambers | 96/84 |
| 3,515,584 | 6/1970 | Yang | 117/212 |
| 3,549,367 | 12/1970 | Chang et al. | 96/35.1 |
| 3,552,973 | 1/1971 | Fishman | 96/90 |
| 3,563,751 | 2/1971 | Cohen | 96/90 |
| 3,574,618 | 4/1971 | Carreira | 96/1.4 |
| 3,649,268 | 3/1972 | Chu et al. | 96/27 R |
| 3,652,275 | 3/1972 | Baum et al. | 96/48 |
| 3,661,576 | 5/1972 | Crary | 96/35.1 |
| 3,730,717 | 5/1973 | Chu et al. | 96/27 R |
| 3,784,557 | 1/1974 | Cescon | 260/209 |
| 3,854,950 | 12/1974 | Held | 96/82 |
| 3,957,515 | 5/1976 | Robillard | 96/48 HD |
| 4,087,828 | 5/1978 | Lind et al. | 346/158 |
| 4,111,692 | 9/1978 | Etoh et al. | 96/1 R |
| 4,129,486 | 12/1978 | Deutsch | 204/159 |
| 4,149,798 | 4/1979 | McGowan et al. | 355/8 |
| 4,162,162 | 7/1979 | Dueber | 96/115 |
| 4,170,481 | 10/1979 | Akama et al. | 96/115 |
| 4,174,216 | 11/1979 | Cohen et al. | 430/257 |
| 4,233,390 | 11/1980 | Jargiello | 430/156 |
| 4,252,887 | 2/1981 | Dessauer | 430/281 |
| 4,264,708 | 4/1981 | Chambers et al. | 430/278 |
| 4,298,678 | 11/1981 | McKeever | 430/281 |
| 4,311,783 | 1/1982 | Dessauer | 430/270 |
| 4,346,162 | 8/1982 | Abele | 430/270 |
| 4,356,252 | 10/1982 | Lee | 430/270 |
| 4,358,529 | 11/1982 | Abele | 430/270 |
| 4,434,223 | 2/1984 | Kohira et al. | 430/273 |
| 4,459,349 | 7/1984 | Tanaka et al. | 430/281 |

FOREIGN PATENT DOCUMENTS

| 618594 | 4/1961 | Canada . |
|---|---|---|
| 618521 | 4/1961 | Canada . |
| 1026144 | 4/1966 | United Kingdom . |

OTHER PUBLICATIONS

Anonymous, "Electrostatic-Washout Imaging of Photopolymerizable Systems," Research Disclosure, 3/77, ItemNo. 15514, pp.9-10.
Derwent Abstract 51074X/27, Japanese Patent Publication J5 1058-116, Canon KK, 11/74.
Derwent Abstract 68566X/35, Japanese Patent Publication J5 1081-620, Toppan Printing, 1/75.
Derwent Abstract 18789A/10, Japanese Patent Publication J5 3009-538, Toyobo KK, 7/76.

Primary Examiner—J. David Welsh

[57] ABSTRACT

Xeroprinting process involving imagewise exposing a photopolymer master, charging on a conductive support, toning with dry or liquid electrostatic toner, and transferring to another surface. Photopolymer systems comprising preferred combinations of polymeric binders, ethylenically unsaturated monomers, HABI initiators and chain transfer agents.

22 Claims, No Drawings

XEROPRINTING WITH PHOTOPOLYMER MASTER

This application is a continuation of Ser. No. 858,172 filed May 1, 1986, now abandoned.

FIELD

This invention relates to the field of xeroprinting. More specifically, it relates to the use in xeroprinting of electrostatic printing plates (masters) which are based on photopolymerizable systems (compositions) and which require no processing between exposure and toning. It also relates to photopolymerizable (photopolymer) systems containing hexaarylbiimidazole (HABI) initiators.

BACKGROUND

Xeroprinting is a process in which a plate having a permanent or persistent image or pattern of insulating material on a grounded conductive backing is charged, e.g., by corona discharge, to produce a latent image of electrostatic charge on the insulating areas, the image is developed by toning with oppositely charged particles, and the toner image is transferred by electrostatic or other means to another surface such as paper or polymeric film. Since the original image is permanent or persistent, multiple copies can be made with a single exposure by repeating the charging, toning and transfer steps.

Various methods have been devised to prepare electrostatic masters. One method, disclosed in U.S. Pat. No. Schaffert 2,576,041 and Yang 3,515,584, involves coating an electrically conductive backing plate with a hardenable material, exposing to light through a negative to harden exposed areas, and washing out unexposed areas. This method has the disadvantage of requiring a processing step (wash-out) between exposure and toning.

Another method, known as chemography, involves coating a conductive substrate with an insulating layer containing a chemical sensitizer which increases in conductivity when exposed to light. Imagewise exposure creates a pattern of exposed and unexposed zones differing in conductivity. Charging creates an image of electrostatic charge on the unexposed, lower conductivity areas. Toning the entire layer with oppositely charged particles produces a toner image on the unexposed areas which can be transferred to another surface in the xeroprinting process. Patents which relate to this method include Ebert Canadian Nos. 618,521 and 618,594; Cassiers et al. U.S. Pat. No. 3,113,022; Hepher U.S. 3,311,471 and Etoh et al. U.S. Pat. No. 4,111,692.

The Canadian patents also describe a corollary, opposite embodiment in which imagewise exposure to light results in decreased conductivity in exposed areas, and charging creates a latent electrostatic image on the exposed areas. An example of this appears in the Canadian No. 618,594 in which the sensitizer was chloroacetic acid.

It is known that photopolymerizable systems based on ethylenically unsaturated monomers decrease in conductivity upon polymerization. This property has been used in electrographic application, but apparently not in xeroprinting. For example, Ingersoll U.S. Pat. No. 3,286,025 discloses imagewise exposing a photopolymerizable layer comprising a polymeric binder, an ethylenically unsaturated monomer and, optionally, a photoinitiator. The exposure creates polymerized areas of reduced conductivity, which can be corona charged on a conductive support and toned to form a toner image. The patent does not disclose transferring the toner image to another support; it does state that multiple copies can be made, but the procedure involves washing out nonimage areas with a solvent, then placing the plate on an offset press and printing by lithographic techniques.

Although the Ingersoll patent states that either electron beam or actinic radiation can be used for exposure all examples use electron beam. The patent discloses various methods of reading the image obtained by exposure; Example XIII is the only one which illustrates toning. Experiments with a system similar to that used in Example XIII indicate that such a system, when exposed with actinic radiation, is not polymerized sufficiently to retain charge long enough for toning. These experiments are reported in Example 9 below. The photoinitiator used, an anthraquinone, was not as effective as the HABI initiators used in this invention.

HABI-initiated photopolymerizable systems have been used in an electrostatic imaging application. Research Disclosure, item number 15514, pages 9–10, March 1977, discloses a process involving briefly exposing a photopolymerizable system imagewise to increase electrical resistance without substantial polymerization, corona charging to produce an electrostatic image, and toning to develop the image. The system exemplified was the system of Chang U.S. Pat. No. 3,549,367, Example 2. This system contained a HABI initiator, 2-(o-chlorophenyl)-4,5-bis(methoxyphenyl)imidazolyl dimer; a binder, poly(methylmethacrylate/methacrylic acid); a monomer trimethylolpropane triacrylate; and a co-initiator, 4,4'-bisdimethylamino-benzophenone. There is no indication in the Research Disclosure item that the system could be used in an electrostatic master for xeroprinting, i.e., that the toner image could be transferred. Instead, it is disclosed that the toned element can be re-exposed for a longer time to polymerize previously unexposed areas, then the previously exposed areas can be washed out to yield a printing plate.

The Chang et al. patent is one of several which disclose HABI-initiated photopolymerizable systems for use in non-electrostatic imaging processes. Others are identified below. Films based on such systems are sold commercially for non-electrostatic imaging applications.

The only known prior disclosure of the use of a photopolymer system to produce a master for xeroprinting is in Bickmore U.S. Pat. No. 3,518,081 (U.S. Pat. No. Re. 29357). In this patent, a photopolymer is imagewise exposed to polymerize exposed areas, then the entire surface is rubbed with another material to produce a triboelectric charge pattern corresponding to the image. This pattern can be toned to produce a toner image which can be transferred to another surface. This process does not depend on differing conductivity of exposed and unexposed areas, but on differences in triboelectric charging characteristics. The patent states that one attempt to charge an imagewise exposed photopolymer layer by corona discharge, followed by toning, produced no visible image.

SUMMARY OF THE INVENTION

In one aspect this invention is a process of xeroprinting which comprises the steps:

(1) imagewise exposing to actinic radiation an electrostatic master having a photopolymerizable conductive film to selectively polymerize and thereby increase resistance in exposed areas of the film;

(2) charging the master by corona discharge while on a conductive support to form a latent image of electrostatic charge on the exposed areas;

(3) developing the image by applying an oppositely charged electrostatic toner; and (4) transferring the toner image to another surface.

Photopolymerizable compositions (systems) which can be used to provide an electrostatic master for this invention consist essentially of a polymeric binder, an ethylenically unsaturated monomer, a 2-o-substituted hexaarylbiimidazole photopolymerization initiator, and a chain transfer agent. It has been found with these compositions that exposed (polymerized) areas accept a high initial charge and retain a significant portion of that charge long enough to permit toning, whereas the charge in the unexposed areas decays rapidly to substantially zero. Thus, the master can be toned to develop the latent electrostatic image without the need for a processing step, such as solvent wash-out to remove unexposed areas, between exposure and charging. Since the polymerization produced by exposure is permanent, multiple copies can be made with a single exposure by repeating only the charging, toning, and transferring steps. Since charge decay in the unexposed areas is rapid, toning can be done shortly after charging, so a multi-copy xeroprinting process can be carried out at a rapid rate. With these compositions the process of the invention is capable of producing high quality, high resolution images.

The process can be used for a variety of purposes, including short run printing, making color proofs, reproducing engineering drawings, and printing integrated circuit boards.

In another aspect the invention is a preferred photosensitive system for use in electrostatic masters consisting essentially of a binder selected from poly(styrene/-methylmethacrylate) and poly(methylmethacrylate), a monomer selected from ethoxylated trimethylol propane triacrylate and polyethylene glycol dimethacrylate, an initiator selected from 2,2',4,4'-tetrakis(o-chloropheynyl)-5,5'-bis(m,p-dimethoxyphenyl)-biimidazole and 2,2'-bis(o-chlorophenyl)-4,4', 5,5'-tetraphenylbiimidazole, and a chain transfer agent selected from 2-mercaptobenzoxazole and 2-mercaptobenzthiazole. These compositions, in addition to providing excellent charge retention/decay characteristics, are resistant to hydrocarbon solvents typically used as dispersants in liquid toners. Also, a system in which the binder is polymethylmethacrylate provides especially high quality, high resolution images on both master and transfer surface.

DETAILED DESCRIPTION

Initiators

The HABI photoinitiators are 2,2'4,4',5,5'-hexaarylbiimidazoles, sometimes called 2,4,5-triarylimidazolyl dimers, which dissociate on exposure to actinic radiation to form the corresponding triarylimidazolyl fee radicals. As indicated above, HABI's and use of HABI-initiated photopolymerizable systems for applications other than xeroprinting are disclosed in a number of patents. These include: Cescon U.S. Pat. No. 3,784,557; Chambers U.S. Pat. No. 3,479,185; Chang et al. U.S. Pat. No. 3,549,367; Baum et al. U.S. Pat. No. 3,652,275; Dueber U.S. Pat. No. 4,162,169; Dessauer U.S. Pat. No. 4,252,887; Chambers et al. U.S. Pat. No. 4,264,708; and Tanaka et al., U.S. Pat. No. 4,459,349; the disclosures of these patents are incorporated herein by reference. Any 2-o-substituted HABI disclosed in the prior patents can be used in this invention. The HABI's can be represented by the general formula

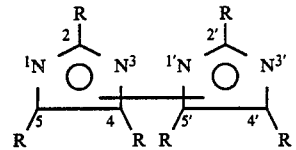

where the R's represent aryl radicals. The 2-o-substituted HABI's are those in which the aryl radicals at positions 2 and 2' are ortho-substituted. The other positions on the aryl radicals can be unsubstituted or carry any substituent which does not interfere with the dissociation of the HABI upon exposure or adversely affect the electrical or other characteristics of the photopolymer system.

Preferred HABI's are 2-o-chlorosubstituted hexaphenylbiimidazoles in which the other positions on the phenyl radicals are unsubstituted or substituted with chloro, methyl or methoxy. The most preferred HABI's are 2,2',4,4'-tetrakis(o-chlorophenyl)-5,5'-bis(m,p-dimethoxyphenyl)-biimidazole and 2,2'-bis(o-chlorophenyl)-4,4',5,5'-tetraphenylbiimidazole.

Chain Transfer Agents

Any chain transfer agent (CTA) identified in the prior patents for use with HABI-initiated photopolymerizable systems can be used. For example, Baum et al. U.S. Pat. No. 3,652,275 lists N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis(mercaptoacetate), 4-acetamidothiophenol, mercaptosuccinic acid, dodecanethiol, and beta-mercaptoethanol. Others which can be used include various tertiary amines known in the art, 2-mercaptoethane sulfonic acid, 1-phenyl-4H-tetrazole-5-thiol, 6-mercaptopurine monohydrate, bis-(5-mercapto-1,3,4-thiodiazol-2-yl, 2-mercapto-5-nitrobenzimidazole, and 2-mercapto-4-sulfo-6-chlorobenzoxazole. The preferred CTA's are 2-mercaptobenzoxazole and 2-mercaptobenzthiazole.

Monomers

Any ethylenically unsaturated photopolymerizable or photocrosslinkable compound identified in the prior patents for use in HABI-initiated systems can be used. The term "monomer" as used herein includes simple monomers as well as polymers, usually of molecular weight below 1500, having crosslinkable ethylenic groups. Preferred monomers are di-, tri- and tetra-acrylates and -methacrylates such as ethylene glycol diacrylate, diethylene glycol diacrylate, triethylene glycol diacrylate, glycerol diacrylate, glycerol triacrylate, ethylene glycol dimethacrylate, 1,2-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, pentaerythritol triacrylate; the bisacrylates and methacrylates of polyethylene glycols of molecular weight 100–500, and the like. The preferred monomers are ethoxylated trimethylolpropane triacrylate and polyethylene glycol 200 dimethacrylate.

The monomer is the major charge carrier in the photosensitive system. The monomer must have sufficient conductivity that the charge in unexposed areas will decay to zero or almost zero within about 15 seconds after charging. On the other hand, it is believed desirable that the unexposed areas accept some initial charge and retain it for a few seconds, to facilitate toning of small exposed dots in highlight areas, i.e., to avoid having charge dissipate too rapidly from small, isolated exposed dots into large surrounding unexposed areas. Thus, it is considered desirable to use a monomer with a resistivity in the range of about $10^5$ to $10^9$ ohm·cm.

Binders

Suitable binders include: the polymerized methylmethacrylate resins including copolymers thereof, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubbers (e.g., butadiene/acrylonitrile copolymers and chloro-2-butadiene-1,3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate), polyvinyl chloride and copolymers (e.g., polyvinyl chloride/acetate), polyurethanes, polystyrene. Preferred binders are poly(styrene/methylmethacrylate) and polymethyl methacrylate.

The binder must have sufficiently high resistivity that charge will decay slowly in the exposed areas. On the other hand, if the binder resistivity is too high, the exposed area discharge rate may to too slow, resulting in overtoning of solids and overfilling of large dots. Also, unexposed area discharge rate may be too slow, reducing the speed at which multiple copies can be printed. Therefore, the binder should have a resistivity of about $10^{14}$ to $10^{20}$ ohm·cm. Initially it was thought that binders with resistivity in the upper end of the range, e.g., $10^{18}$–$10^{20}$ ohm·cm would be preferred because they would permit a higher initial charge and slower decay rate in exposed areas. However, based on recent work, binders with lower resistivity, e.g., $10^{14}$ to $10^{16}$ ohm·cm are preferred because of improved image quality.

Proportions

In general, the essential components should be used in the following approximate proportions: binder 40–65 percent, preferably 50–60 percent; monomer 20–40 percent, preferably 25–35; initiator 1–30 percent, preferably 5–20 percent; and chain transfer agent 1–10 percent, preferably 3–8 percent. These are weight percentages based on total weight of the photopolymerizable system. The preferred proportions depend upon the particular compounds selected for each component, and the use for which the system is intended. For example, a high conductivity monomer can be used in smaller amount than a low conductivity monomer, since the former will be more efficient in eliminating charge from unexposed areas.

The amount of HABI will depend upon film speed requirement. Systems with HABI content above 10% provide films of high sensitivity (high speed) and can be used with laser imaging in recording digitized information, as in digital color proofing. Such films are the subject of a commonly assigned application filed simultaneously herewith. For analog applications, e.g., exposure through a negative, film speed requirement depends upon mode of exposure. If the exposure device is a flat-bed type, where the negative is placed over the photopolymer matrix, a 30 sec. exposure can be used and a slow film will be acceptable. For a drum exposure device, with a collimated source of radiation, the exposure period will be brief and a higher speed film must be used.

Additives/Coating/Substrates

In addition to the essential ingredients, the systems can contain such components as thermal polymerization inhibitors, visible light sensitizers, UV absorbers, plasticizers, leuco dyes and pigments. The maximum total amount of such additives will ordinarily be about 15% based on total weight of the system.

Film is prepared by mixing the ingredients of the photopolymerizable system in a solvent such as methylene chloride, usually in a weight ratio of about 15:85, coating a substrate, and evaporating the coating. Coating thickness should be uniform and about 5 to 20 microns dry. Dry coating weight should be about 50 to 200 mg/sq. dm.

The substrate can be a conductive sheet such as aluminized polyethylene terephthalate, conductive paper, metal sheet or polymeric film. In this case the substrate can be mounted on a conductive support on the printing device. Alternatively, the substrate can be a non-conducting film, preferably a release film such as polyethylene or polypropylene. The film can then be laminated to the conductive support on the printing device, with the tacky, photopolymerizable layer adjacent the support. The substrate then acts as a coversheet which is removed prior to charging. This is preferable, because it is difficult to mount an aluminized polyester film on a support without introducing defects, e.g., air pockets. As another alternative, the film can be mounted on an aluminum, brass or other metal sheet which can act as the conductive support on the printing device. In any case, a release film should be placed over the photopolymerizable layer after the solvent evaporates. The substrate should be uniform and free of defects such as pinholes, bumps and scratches.

Electrical Characteristics

To compare photopolymerizable systems for suitability in xeroprinting, voltage is measured in both exposed and unexposed areas within one second after charging (VO), at 15 second intervals for one minute after charging (V15, V30, V45, V60), and at two minutes after charging (V120), using standard conditions of exposing, charging and measuring as described in the Examples section.

The desired electrical properties of the system are dependent on the charge deposited on the photosensitive surface and the electrical characteristics of the particular toner system employed. Ideally, at the time of contact with the toner dispersion, the voltage in exposed areas (VTe) should be at least 10 V, preferably at least 100 V, more than that of the voltage in unexposed areas (VTu); best results are obtaind when VTu has decayed to near zero or zero. Depending on the choice of toner, VTe should be at least 10 V, preferably at least 150 V and can be 400 or more, and preferably VTu=0.

An ideal time for toner application is between 5 and 15 seconds after charging; where toner application occurs at a later time, e.g., 60 seconds after charging, the values of VTe and VTu should be as above. As these systems may be used in applications where toning can occur at some variable time, it is desirable for the change in the exposed areas to be slow, so that percent charge decay in exposed areas, defined as 100(1-V120/V15) is less than 50% and preferably less than 30%. Resistivity of the exposed areas should be between about $10^{14}$ and $10^{17}$ ohm·cm. Resistivity in the unexposed areas should be between $10^{12}$ and $10^{15}$ ohm·cm and the ratio of resistivity in exposed areas to resistivity in unexposed areas should be at least 100.

Exposure/Charging/Toning/Transfer

As already indicated, exposing radiation can be modulated by either digital or analog means. Analog exposure utilizes a line or half-tone negative or other pattern interposed between radiation source and film. For analog exposure, UV light source is preferred, since the photopolymerizable system is most sensitive to shorter wavelength light. Digital exposure is by means of a computer controlled visible light-emitting laser which scans the film in raster fashion. For digital exposure a high speed film, i.e., one containing a high-level of HABI and sensitized to higher wavelength light with a sensitizing dye, should be used. Exposure must be sufficient to cause substantial polymerization in exposed areas and provide the required differential in conductivity between exposed and unexposed areas. Electron beam exposure can be used, but is not required, and is not preferred because of the expensive equipment required.

The preferred charging means is corona discharge. Other charging methods, e.g., discharge of a capacitor, can also be used.

Any electrostatic toner and any method of toner application can be used. It is preferred to use a liquid toner, i.e., a suspension of toner particles in a dispersant liquid. The liquids normally used are the Isopar® branched-chain aliphatic hydrocarbons sold by Exxon Corporation. These are narrow high-purity cuts of isoparaffinic hydrocarbon fractions with the following boiling ranges: Isopar®-G, 157°–176° C.; Isopar®-H 176°–191° C.; Isopar®-K 177°–197° C.; Isopar®-L 188°–206° C.; Isopar®-M 207°–254° C.; Isopar®-V 254°–329° C. Many of the monomers useful in the process of this invention are soluble in these Isopar® hydrocarbons, especially in the preferred Isopar®-H. Consequently, repeated toning with Isopar® based toners to make multiple copies can deteriorate the electrical properties of the master by extraction of monomer from unexposed areas. The preferred monomers are relatively insoluble in Isopar® hydrocarbons, and extended contact with these liquids does not unduly deteriorate films made with these monomers, as illustrated in the Examples. Masters made with other, more soluble monomers can still be used to make multiple copies, using dry toner or liquid toner having a dispersant with less solvent action.

After toning the toner image is transferred to another surface, such as paper, polymeric film or cloth. For making integrated circuit boards, the transfer surface can be an insulating board on which conductive circuit lines can be printed by this process, or it can be an insulating board covered with a conductor (e.g., a fiber glass board covered with a copper layer) on which a resist is printed by this process. Transfer is accomplished by electrostatic or other means, e.g., by contact with an adhesive receptor surface. Electrostatic transfer can be accomplished in any known manner, e.g., by placing the transfer surface in contact with the toned image, applying a squeegee to assure maximum contact, and applying corona discharge to the backside of the transfer element. It is preferred to transfer the image across a gap as described in Example 10 below.

EXAMPLES

In these examples, ingredient designations have the following meanings:

Binders (B)

PSMMA: poly(styrene/methylmethacrylate)70/30, resistivity $10^{19}$ ohm·cm
PMMA: polymethylmethacrylate, inherent viscosity 1.25 resistivity $10^{15}$ ohm·cm
Butver®B 76: polyvinyl butyral
Occidental 413: polyvinyl chloride terpolymer
CAS: cellulose acetate succinate

Monomers (M)

TMPTETA: ethoxylated trimethylol propane triacrylate, resistivity $1.72 \times 10^8$ ohm·cm
PEGDMA: polyethylene glycol 200 dimethacrylate, resistivity $1.6 \times 10^7$ ohm·cm
TMPTA: trimethylol propane triacrylate, resistivity $5.9 \times 10^8$ ohm·cm
DCPA: dicyclopentyl acrylate
BPEDMA: ethoxylated bisphenol A dimethacrylate, resistivity $5.25 \times 10^8$ ohm·cm
TEDA: triethylene glycol diacrylate
PETA: pentaerythritol triacrylate, resistivity $3.85 \times 10^8$ ohm·cm.

Initiators (I)

TCTM-HABI: 2,2',4,4'-tetrakis(o-chlorophenyl)-5,5'-bis(m,p-dimethoxyphenyl)biimidazole (recrystallized from methanol/methylene chloride)
o-Cl-HABI: 2,2'-bis(o-chlorophenyl)-4,4,5,5'-tetraphenylbiimidazole (recrystallized from methanol/methylene chloride)
TCDM: 2,2',4,4'-tetrakis(o-chlorophenyl)-5,5'-bis(m,p-dimethoxyphenyl)biimidazole
o-ethoxy-HABI: 2,2'-bis(o-ethoxyphenyl)-4,4',5,5'-tetraphenylbiimidazole
o-Cl-p-nitro-HABI: 2,2'-bis(o-chloro-p-nitrophenyl)-4,4',5,5'-tetraphenylbiimidazole
o-methoxynaphthyl-HABI: 2,2'-bis(o-methoxynaphthyl)-4,4',5,5'-tetraphenylbiimidazole
p-Br-HABI: 2,2'-bis(o-bromophenyl)-4,4'5,5'-tetraphenylbiimidazole
BME: benzoin methyl ether
2-Et-Aq: 2-ethylanthraquinone

Chain Transfer Agents

2-MBO: 2-mercaptobenzoxazole, recrystallized from methanol/methylene chloride
2-MBT: 2-mercaptobenzthiazole

Stabilizer

TAOBN: 1,4,4-trimethyl-2,3-diazobicyclo(3.2.2)-non-2-ene-2,3-dioxide

Except as indicated otherwise, the procedure in all examples was as follows:

A solution containing 85 parts methylene chloride and 15 parts photosensitive system (B/M/I/CTA plus optional ingredients) was coated on Talboy's coater onto 4 mil aluminized polyethyleneterephthalate film at a 4–6 mil wet level and the solvent evaporated at 190° F. to provide a photosensitive layer of about 0.3 to 0.6 mil thickness and a coating weight of about 100 mg/sq. dm. A ¾ mil coversheet of polypropylene was laminated to the tacky coating.

Several 2"×6" samples of the film were exposed through the coversheet and a square root of 2 step tablet in a Berkey Ascor 30×40 contact printer under vacuum (2 kw photopolymer lamp) manufactured by Burgess Industries, Plymouth, MN, for 8 units (ca. 16 seconds) corresponding to about 40 mj/sq. cm.

The coversheet was removed from one sample of the film, and 0.25 sq. inch area of coating was removed with solvent. A metallic tape attached to a grounding wire was adhered to the bare aluminized polyester film. The film was placed on a B2S09BHJ Uni Slide (Velmex) Serial No. 784 and charged positively using a single wire corona driven by a Monroe Electronics Model #3020 power supply set at 7.2 kV, with the photosensitive coating facing the corona and with a 0.25 inch gap between wire and coated surface. A single pass of the device was employed moving at a rate of 1 inch per second.

Initial voltage VO was measured within one second after charging, and voltage was measured at 15 second intervals up to one minute (V15 . . . V60) and at two minutes (V120), using a #244 Monroe Isoprobe ® electrostatic voltmeter with a miniature probe. Voltages were measured in both exposed and unexposed areas. Percent decay in exposed areas was calculated as 100(1-V120/V15).

Immediately after charging, a second film sample was dipped for about 5 seconds into a dispersion of negatively charged toner in Isopar ®-H (2% solids). The toned film sample was held up and squirted with fresh Isopar ®-H solvent to remove excess toner, and was left to dry. Film speed was recorded as the first step of the step-tablet which was sufficiently opaque that the film under that step was unexposed, and therefore retained no charge and no toner, i.e., the first clear step. The amount of exposure reaching the film through the next lower step was recorded as film speed, in millijoules per square centimeter (mj/sq. cm.) Lower numbers indicate higher speed.

In some examples 2 sets of data are given for each composition tested. The second set are data obtained in testing for inertness to Isopar ®-H. In this test, third and fourth samples of film were prepared, exposed and charged as described above. Immediately after charging the coversheet was removed from the samples and the samples were placed in a jar containing about 100 grams of Isopar ®-H and a magnetic stirrer. The samples were agitated for 30 minutes. The film was removed and the liquid was wiped off. The third sample was then charged and voltages measured as above. The fourth sample was toned and film speed determined as described above.

In the examples, all parts and percentages are by weight. Percentages for individual ingredients of the photosensitive system (binder B, monomer M, initiator I, chain transfer agent CTA, etc.) are based on the weight of all ingredients in the coating composition, excluding solvent.

EXAMPLE 1

This example illustrates use of various HABI's and HABI combinations at 6% and 12% concentrations in photopolymerizable systems containing PSMMA binder (55 or 61%, depending on HABI concentration), TMPTETA monomer (31%), 2-MBO chain transfer agent (2.8%) and TAOBN stabilizer (0.03%).

TABLE 1

| INITIATOR (±) | EXPOSED V15 | V120 | PER-CENT DECAY | UNEXPOSED V15-V60-120 | SPEED mj/cm² |
|---|---|---|---|---|---|
| TCTM-HABI (12%) | 1256 | 927 | 26 | 0 | 0.35 |
|  | 1077 | 877 | 19 | 0 |  |
| TCTM-HABI (6%) | 1456 | 1180 | 26 | 0 | 0.25 |
|  | 1119 | 883 | 22 | 7-5-5 |  |
| o-Cl—HABI (12%) | 843 | 658 | 22 | 0 | 1.6 |
|  | 819 | 718 | 12 | 11-0-0 |  |
| o-Cl—HABI (6%) | 1009 | 837 | 11 | 0 | 2.2 |
|  | 915 | 685 | 25 | 0 |  |
| TCDM-HABI (12%) | 1302 | 957 | 24 | 0 | 0.2 |
|  | 1416 | 28 | 0 |  |  |
|  | 1026 |  |  |  |  |
| TCDM-HABI (6%) | 1127 | 976 | 13 | 0 | 0.35 |
|  | 1399 | 1068 | 24 | 0 |  |
| o-Ethoxy-HABI (12%) | 1503 | 1072 | 29 | 0 | 0.75 |
|  | 1455 | 1072 | 26 | 48-27-18 |  |
| o-Ethoxy-HABI (6%) | 1341 | 982 | 27 | 0 | 4.4 |
|  | 1171 | 839 | 28 | 20-0-0 |  |
| TCTM-HABI (6%) + | 1109 | 0842 | 24 | 0 | 1.6 |
| o-Cl—HABI (6%) | 1022 | 801 | 22 | 0 |  |
| TCTM-HABI (3%) + | 1135 | 945 | 17 | 0 | 1.6 |
| o-Cl—HABI (3%) | 858 | 782 | 18 | 0 |  |
| o-Chloro-p-nitro-HABI (6%) | 1563 | 1163 | 23 | 0 | 0.5 |
|  | 746 | 580 | 22 | 939-326-279 |  |
| o-Methoxynaphthyl HABI (6%) | 1153 | 847 | 27 | 0 | 2.2 |
|  | 1243 | 827 | 34 | 0 |  |

EXAMPLE 2

This example illustrates use of various chain transfer agents and various amounts of the preferred CTA, 2-MBO. In these compositions, binder B was PSMMA, monomer M was TMPTETA, and initiator I was TCTM-HABI.

TABLE 2

| PERCENT B/M/I | CTA | PERCENT CTA | EXPOSED V15 | EXPOSED V120 | PERCENT DECAY | UNEXPOSED V15 | UNEXPOSED V60 | UNEXPOSED V120 | SPEED mj/cm² |
|---|---|---|---|---|---|---|---|---|---|
| 61 28 11 | 1 | 1.3 | 1338 | 953 | 26 | 6 | 4 | 4 | 0.35 |
|  |  |  | 1726 | 1315 | 24 | 10 | 0 | 0 | 0.35 |
| 59 28 11 | 1 | 2.5 | 1311 | 1049 | 20 | 0 |  |  | 0.5 |
|  |  |  | 1272 | 1114 | 12 | 0 |  |  | 0.50 |
| 57 28 11 | 1 | 3.8 | 1603 | 1388 | 13 | 0 |  |  | 0.75 |
|  |  |  | 1284 | 1077 | 17 | 0 |  |  | 0.75 |
| 55 28 11 | 1 | 5.0 | 1352 | 1194 | 12 | 0 |  |  | 0.35 |
|  |  |  | 1027 | 930 | 23 | 0 |  |  | 0.35 |
| 53 28 11 | 1 | 6.3 | 1382 | 1201 | 13 | 0 |  |  | 0.5 |
|  |  |  | 1297 | 1020 | 20 | 0 |  |  | 0.50 |
| 59 28 11 | 2 | 2.5 | 1148 | 1056 | 8 | 18 | 6 | 6 | 0.175 |
|  |  |  | 1027 | 903 | 12 | 20 | 6 | 6 | 0.20 |
| 57 28 11 | 2 | 3.8 | 1404 | 1263 | 10 | 18 | 6 | 6 | 0.125 |
|  |  |  | 1372 | 1090 | 21 | 8 | 5 | 5 | 0.15 |
| 59 28 11 | 3 | 2.5 | 882 | 559 | 37 | 32 | 8 | 6 | 0.075 |
|  |  |  | 963 | 520 | 46 | 31 | 7 | 6 | 1.05 |
| 59 28 11 | 4 | 2.5 | 1162 | 1034 | 11 | 0 |  |  |  |
|  |  |  | 1262 | 968 | 23 | 7 | 0 | 0 | 0.50 |
| 59 28 11 | 5 | 2.5 | 673 | 629 | 6 | 48 | 19 | 11 | 0.35 |
|  |  |  | 717 | 616 | 14 | 26 | 7 | 4 | 0.35 |
| 62 28 11 | — | 0 | 7 | 0 | 100 | 0 |  |  |  |
|  |  |  | 7 | 0 | 100 | 0 |  |  |  |

CTA 1 is 2-MBO
CTA 2 is 2-MBT
CTA 3 is tris(p-diethylamino-o-tolyl)methane
CTA 4 is dimedone
CTA 5 is mixture of 9-dihydropyridine esters

EXAMPLE 3

This example illustrates different levels of the preferred initiator. TCTM-HABI. In these compositions, the binder was poly(styrene/methylmethacrylate), the monomer was TMPTETA, the initiator was TCTM-HABI and the chain transfer agent was 2-MBO.

TABLE 3

| PERCENT B/M/I/CTA | EXPOSED V15 | EXPOSED V120 | PERCENT DECAY | UNEXPOSED V15 V60 V120 | SPEED mj/cm² |
|---|---|---|---|---|---|
| 30/31/35/4 | 523 | 388 | 26 | 0 | 0.175 |
|  | 967 | 723 | 25 | 57-34-27 |  |
| 43/31/23/3 | 781 | 568 | 27 | 25-8-6 | 0.25 |
|  | 738 | 560 | 24 | 13-8-6 |  |
| 55/31/12/2 | 1082 | 930 | 14 | 0 | 0.35 |
|  | 949 | 751 | 12 | 0 |  |
| 61/31/6/2 | 1192 | 1000 | 26 | 0 | 0.5 |
|  | 1116 | 837 | 25 | 0 |  |

EXAMPLE 4

This example illustrates the effect of various additives on a preferred formulation containing PSMMA binder (54%), TMPTETA, monomer (31%), TCTM-HABI (12%), 2-MBO chain transfer agent (2.8%) and TAOBN stabilizer (0.03%).

TABLE 4

| Additive | EXPOSED V15 | EXPOSED V120 | PERCENT DECAY | UNEXPOSED V15 V60 V120 | SPEED mj/cm² |
|---|---|---|---|---|---|
| None-control | 1321 | 1129 | 10 | 0 | 0.35 |
|  | 1348 | 1063 | 23 | 14-7-7 |  |
| 0.5 Cyasorb 24 UV absorber | 1145 | 1037 | 9 | 0 | 0.35 |
|  | 1075 | 837 | 18 | 16-9-9 |  |
| 0.5% Tinopal SFG fluorescent whitener | 1356 | 1192 | 13 | 0 | 0.35 |
|  | 996 | 860 | 14 | 15-8-7 |  |
| 0.5% Tinopal PCR fluorescent whitener | 937 | 869 | 7 | 0 | 0.35 |
|  | 1145 | 957 | 16 | 13-7-3 |  |
| 0.3% Phenidone | 1134 | 1031 | 9 | 0 | 1.6 |
|  | 1056 | 888 | 16 | 12-7-6 |  |
| 0.2% Cyasorb 0.2% Tinopal SFG 0.2% Tinopal PCR | 1046 | 911 | 9 | 0 | 0.25 |
|  | 946 | 844 | 12 | 16-8-6 |  |
| 0.5% Dimethoxy-JDI* sensitizing dye | 913 | 825 | 10 | 13-0-0 | 0.125 |
|  | 973 | 832 | 14 | 35-14-10 |  |

*Dimethoxy-JDI is a condensation product of 3,4-dimethoxy-indanone-1 and 6-formyl-julolidine

EXAMPLE 5

This example illustrates various compositions which are stable in Isopar®-H. All of these compositions contained PSMMA binder, 2-MBO chain transfer agent (2-3%) and TAOBN stabilizer (0.03%)

TABLE 5

| M | I | PERCENT B/M/I | EXPOSED/ V120 | % DECAY | UNEXPOSED UN V15 V120 | | | SPEED mj/ sq cm | COATING mg/ sq dm |
|---|---|---|---|---|---|---|---|---|---|
| 1 | 1 | 43/31/23 | 443 | 35 | 8 | 21 |  | 2.4 | 101 |

TABLE 5-continued

| M | I | PERCENT B/M/I | EXPOSED/ V120 | % DECAY | UNEXPOSED UN | V15 | V120 | SPEED mj/ sq cm | COATING mg/ sq dm |
|---|---|---|---|---|---|---|---|---|---|
|   |   |                | 568 | 23 | 8 | 0 |   |     |    |
| 1 | 1 | 55/31/12       | 526 | 34 | 8 | 0 |   | 3.5 | 65 |
|   |   |                | 514 | 29 | 8 | 0 |   |     |    |
| 1 | 1 | 61/36/06       | 747 | 26 | 8 | 0 |   | 4.5 | 45 |
|   |   |                | 644 | 29 | 8 | 0 |   |     |    |
| 1 | 1 | 63/31/04       | 301 | 53 | 8 | 0 |   | 4.5 | 42 |
|   |   |                | 627 | 34 | 8 | 0 |   |     |    |
| 1 | 1 | 40/27/30       | 296 | 39 | 8 | 0 |   | 1.2 | 66 |
|   |   |                | 355 | 34 | 8 | 0 |   |     |    |
| 1 | 2 | 55/31/12       | 487 | 35 | 8 | 0 |   | 0.9 | 58 |
|   |   |                | 520 | 25 | 8 | 0 |   |     |    |
| 1 | 2 | 61/31/06       | 390 | 34 | 8 | 0 |   | 1.8 | 57 |
|   |   |                | 374 | 38 | 8 | 0 |   |     |    |
| 1 | 1 | 43/31/16[b]    | 101 | 27 | 1 | 0 |   | 1.2 | 49 |
|   |   |                | 311 | 27 | 1 | 0 |   |     |    |
| 1 | 1 | 61/31/04[c]    | 133 | 20 | 1 | 14|   | 2.4 | 136|
|   |   |                | 761 | 20 | 8 | 14| 0 |     |    |
| 1 | 1 | 54/31/12[d]    | 466 | 26 | 8 | 0 |   | 2.4 | 61 |
|   |   |                | 547 | 15 | 8 | 5 | 0 |     |    |
| 1 | 1 | 54/31/12[e]    | 118 | 71 | 1 | 0 |   |     | 103|
|   |   |                | 720 | 34 | 8 | 17| 7 |     |    |
| 1 | 1 | 54/31/12[f]    | 244 | 60 | 1 | 0 |   |     |    |
|   |   |                | 920 | 30 | 8 | 16| 5 |     |    |
| 1 | 1 | 55/31/12[g]    | 345[a] | 32 | 8 | 15| 4 | 14 |   |
| 2 | 2 | 45/25/28       | 474[a] | 35 | 8 | 8 | 0 |    | 57|
| 2 | 1 | 42/29/27       | 739[a] | 15 | 8 | 0 |   | 0.6 | 98|
| 3 | 1 | 30/43/23       | 669 | 5  | 8 | 0 |   | 2.4 | 114|
|   |   |                | 474 | 14 | 8 | 0 |   |     |    |

UN is units of exposure
Monomer 1 is TMPTETA
Monomer 2 is PEGDMA
Monomer 3 is TMPTA
Initiator 1 is TCTM-HABI
Initiator 2 is o-Cl—HABI

[a]stirred in Isopar ®-H for 30 minutes as described above, same as second set of data for other compositions
[b]also contained 8% Dimethoxy-JDI
[c]also contained 1.5% Dimethoxy-JDI
[d]also contained 1% Tinopal SFG
[e]also contained 1% Tinopal PCR
[f]also contained 0.3% Cyasorb ® 24, 0.3% Tinopal SFG and 0.3% Tinopal PCR
[g]also contained 0.5% phenidone

EXAMPLE 6

This example illustrates formulations which are stable in Isopar®-V. All of these compositions contained 2-MBO chain transfer agent (2-3%) and TAOBN stabilizer (0.03%). All were tested as previously described except that Isopar®-V was used in place of Isopar®-H and the time of stirring was 10 minutes, except as indicated.

TABLE 6

| B | M | I | PERCENT B/M/I | EXPOSED V120 | % DECAY | UNEXPOSED V15 | V120 | SPEED (mj/ sq cm) |
|---|---|---|---|---|---|---|---|---|
| 1 | 1 | 1 | 43/26/29 | 513 | 44 | 9 |   | 0.2 |
|   |   |   |          | 833 | 11 | 56| 0 |     |
| 1 | 2 | 1 | 43/26/29 | 100 | 71 | 0 |   | 0.4 |
|   |   |   |          | 216 | 60 | 0 |   |     |
| 1 | 2 | 1 | 40/27/30 | 90  | 59 | 0 |   | 0.4 |
|   |   |   |          | 257 | 58 | 0 |   |     |
| 1 | 1 | 1 | 29/31/35 | 194 | 38 | 0 |   | 1.7 |
|   |   |   |          | 40  | 44 | 0 |   |     |
| 1 | 1 | 1 | 43/31/23 | 428 | 15 | 0 |   | 1.0 |
|   |   |   |          | 513[a]| 18 | 0 |   |     |
| 1 | 1 | 2 | 36/29/27 | 389 | 24 | 0 |   | 0.1 |
|   |   |   |          | 315 | 42 | 23| 0 |     |
| 2 | 1 | 2 | 40/26/31 | 169 | 70 | 0 |   | 0.6 |
|   |   |   |          | 424 | 56 | 9 | 0 |     |
| 2 | 1 | 2 | 42/25/31 | 411 | 46 | 80| 19|     |

TABLE 6-continued

| B | M | I | PERCENT B/M/I | EXPOSED V120 | % DECAY | UNEXPOSED V15 | V120 | SPEED (mj/ sq cm) |
|---|---|---|---|---|---|---|---|---|
|   |   |   |   | 610 | 37 | 54 | 0 | 0.1 |

[a]stirred in Isopar ® -V for 30 minutes
Binder 1 is PSMMA
Binder 2 is Butvar B76
Monomer 1 is TMPTETA from Alcolac
Monomer 2 is TMPTETA from Arco
Initiator 1 is TCTM-HABI
Initiator 2 is o-Cl—HABI

EXAMPLE 7

This example illustrates various compositions having limited Isopar®-H or V stability. Films of the compositions shown in Table 7 functioned to give images when exposed, charged and toned, but they probably would not allow preparation of multiple copies using Isopar®-based toners. However they can be used with dry toners or liquid toners in which the dispersant is other than Isopar®. In the table, the first 5 compositions were toned with dry toner (Kodak Ektaprint®K), and the last 2 were toned with liquid toner (Versatec T12 and Kodak MX1125). For application of these positively charged toners the photopolymer surface was charged with a negative corona. In addition to the ingredients, indicated in the table, the compositions contained 2-MBO (2-3%) and TAOBN (0.03%).

TABLE 7

| BINDER | MONO-MER | INITI-ATOR | PERCENT B/M/I | PERCENT SENSI-TIZER | SPEED (mj/sq cm) |
|---|---|---|---|---|---|
| 1 | 2 | 2 | 26/33/31 | 5 | 0.9 |
| 2 | 2 | 2 | 44/26/24 | 6 | 1.2 |
| 3 | 2 | 2 | 36/29/27 | 5 | 0.6 |
| 1 | 2 | 2 | 26/33/21 | 6 | 0.4 |
| 3 | 1 | 1 | 44/26/24 | 5 | 0 3 |
| 2 | 1 | 1 | 40/27/25 | 5 | 0.2 |
| 2 | 3 | 1 | 26/33/31 | 6 | 0.1 |

Sensitizer is Dimethoxy-JDI
Binder 1 is PSMMA
Binder 2 is Butvar ® B-76
Binder 3 is Occidental ® 413
Monomer 2 is DCPA
Monomer 1 is TMPTETA
Monomer 3 is BPEDMA
Initiator 2 is o-Cl—HABI
Initiator 1 is TCTM-HABI

EXAMPLE 8

This example illustrates the desirability of using a chain transfer agent. In these compositions the binder B was PMMA, the monomer M was TMPTETA and the chain transfer agent (CTA) was 2-MBO. The compositions also contained 0.2% TAOBN stabilizer. Two units of exposure were used.

TABLE 8

| PERCENT I B/M/I/CTA | EXPOSED V0-V15-V60-V120 | PERCENT DE-CAY | UNEXPOSED V0-V15-V60-V120 |
|---|---|---|---|
| 1 60/30/5/5 | 1670-985-631430 | 56 | 223-0 |
| 1 61.3/30/5/3.8 | 1372-1060-740-536 | 49 | 74-2-0 |
| 1 62.5/30/5/2.5 | 1434-1091-779-578 | 47 | 320-0 |
| 1 63.8/30/5/1.25 | 1644-1153-880-688 | 40 | 818-52-0 |
| 1 65/30/5/0 | 1055-351-106-52 | 85 | 1112-336-81-31 |
| 2 63.8/30/5/1.25 | 1147-311-139-100 | 68 | 300-213-101-92 |
| 2 65/30/5/0 | 763-154-33-10 | 94 | 769-130-25-7 |

Initiator 1 is TCTM-HABI
Initiator 2 is o-Cl—HABI

EXAMPLE 9

This example illustrates the advantage of using a HABI initiator as compared to 2-ethylanthraquinone and also the advantage of using a chain transfer agent in addition to the HABI. In these experiments, 1.3 g of monomer M was added to a solution of 2.5 g cellulose acetate succinate dissolved in aqueous acetone (18 g water + 1 g acetone) and initiator was added at the levels indicated in Table 9. Samples were coated at a thickness t of 1 mil wet and in some cases also 5 mil wet on 4 mil aluminized polyethyleneterephthalate film and allowed to dry. Exposure was 10 units. After exposure and before charging, samples 24–27 were heated in an oven for 5 minutes at 136° C.

TABLE 9

| SAM-PLE | M | I | WT. I, GRAMS | t, MILS | EXPOSED V0-V15-V60 | UN-EXPOSED V0 | V15 |
|---|---|---|---|---|---|---|---|
| 1 | 1 | 2 | 0.02 | 1 | 76-0 | 14 | 0 |
| 2 | 1 | 1 | 0.2 | 2 | 127-11 | 3 | 0 |
| 3 | 1 | 1 | 0.02 | 1 | 3-0 | 3 | 0 |
| 4 | 1 | 2 | 0.2 | 1 | 3-0 | 3 | 3 |
| 5 | 1 | 2 | 0.2 | 1 | 300-81-13 | 2 | 0 |
| 6 | 1 | 1 | 0.2 | 1 | 10-0 | 2 | 0 |
| 7 | 1 | 1 | 0.2 | 5 | 24-0 | 6 | 0 |
| 8 | 1 | 1 | 0.27 | 1 | 31-0 | 2 | 0 |
| 9 | 1 | 1 | 0.27 | 5 | 14-0 | 2 | 0 |
| 10 | 1 | 1 | 0.54 | 1 | 11-0 | 3 | 0 |
| 11 | 1 | 1 | 0.54 | 5 | 33-0 | 2 | 0 |
| 12 | 1 | 1 | 0.81 | 1 | 5-0 | 2 | 0 |
| 13 | 1 | 1 | 0.81 | 5 | 12-2 | 2 | 0 |
| 14 | 1 | 3 | 0.2 | 1 | 52-0 | 3 | 0 |
| 15 | 1 | 3 | 0.2 | 5 | 45-0 | 3 | 0 |
| 16 | 2 | 1 | 0.2 | 1 | 47-8 | 35 | 0 |
| 17 | 2 | 1 | 0.2 | 5 | 17-0 | 6 | 0 |
| 18 | 2 | 1 | 0.03 | 1 | 46-0 | 20 | 0 |
| 19 | 2 | 1 | 0.03 | 5 | 89-0 | 9 | |
| 20 | 2 | 3 | 0.02 | 1 | 20-0 | 16 | 0 |
| 21 | 2 | 3 | 0.02 | 5 | 30-0 | 9 | 0 |
| 22 | 2 | 2 | 0.02 | 1 | 28-0 | 24 | 0 |
| 23 | 2 | 2 | 0.02 | 5 | 203-158-117 | 22 | 0 |
| 24 | 1 | 1 | 0.02 | 1 | 2-0 | 2 | 0 |
| 25 | 1 | 1 | 0.2 | 1 | 0-0 | 0 | 0 |
| 26 | 2 | 1 | 0.2 | 1 | 235-26-0 | 66 | 0 |
| 27 | 2 | 1 | 0.2 | 5 | 186-19-2 | 150 | 50 |

Monomer 1 is TEGDA
Monomer 2 is PETA
Initiator 1 is 1-Et—Aq
Initiator 2 is BME
Sample 5 also contained 0.1 g 2-MBO.

EXAMPLE 10

A photopolymerizable composition was prepared comprising the following ingredients.

| INGREDIENTS | AMOUNT (g) |
|---|---|
| PMMA | 33 |
| TMPTETA | 18 |
| TCTM-HABI | 6 |
| 2-MBO | 3 |
| Methylene chloride | 300 |

The solution was stirred for 24 hours to properly dissolve all components. It was coated on aluminized polyethylene terephthalate using a Talboy's coater. A 6 mil knife was used to determine coating thickness and a polypropylene coversheet was placed on the photopolymer surface immediately after drying in order to protect the surface and to avoid oxygen contamination during exposure.

The images were evaluated using the following procedure. The material was imaged through the coversheet by contact exposure through half-tone negatives using a vacuum frame with an ultraviolet source matching the absorption spectra of the photopolymer (340 nm). The radiation polymerized the imaged areas while the unimaged regions remained in their original monomeric form.

To create and develop a latent image the exposed photopolymer was placed on a testing device which consists of two gear driven aluminum drums that were separated by a 3–5 mil gap. A single wire charging corona and a toning station were placed at the 9 o'clock and 6 o'clock positions of the lower drum, respectively. By rotating the lower drum counterclockwise the master was first charged, then toned and finally the image was transferred onto paper. Although charge was uniformly injected by the corona across the photopolymer surface it was only retained in the imaged areas (polymerized) and discharged within 2 seconds elsewhere. After charging was completed the latent image was toned by rotating the lower drum across the toning station. The experimental charging and toning conditions were about 5.0 kV corona voltage (or equivalent 300 V on the photopolymer surface), 0.5 ips drum speed, 60 mils gap between the toning station and the photopolymer surface with laminar flow on the toner shoe.

The toner used in this example was prepared as described below:

| INGREDIENTS | AMOUNT (g) |
| --- | --- |
| Copolymer of ethylene (89%) and methacrylic acid (11%), melt index at 190° C. is 100, Acid No. is 66 | 200.0 |
| Monastral ® Blue BT 583D, Pigment Blue 15, C.I. No. 74160 | 14.9 |
| Dalamar ® Yellow YT-858D pigment, Heubach, Inc., Newark, NJ | 0.15 |
| Ethylene glycol | 13.3 |
| Isopar ® L, nonpolar liquid having a Kauri-butanol value of 27, Exxon Corporation | 1000.0 |

The ingredients were placed in a Union Process 1S Attritor, Union Process Company, Akron, Ohio along with 0.1875 inch (4.76 mm) diameter carbon steel balls purchased from Union Process Company, Akron, Ohio and the contents were heated to 100° C.+/−10° C. and milled at 220 RPM for 2 hours. The attritor was cooled to 42° C.+/−5° C. with cooling water while the milling continued and 700 g of Isopar ®-H, nonpolar liquid having a Kauri-butanol value of 27, Exxon Corporation were added. Milling was continued at 330 RPM for 5.5 hours with continued cooling whereby a dispersion of toner particles having an average particle size (by area) of 1.6 microns was obtained with 9.5 percent greater than 3 microns and 2.3 percent greater than 10 microns. The toner concentrate was separated from the carbon steel media and diluted to 2 percent solids by the addition of Isopar ®-H. Two kg of toner were charged by the addition of 31.6 g of a 2.5 percent solution of lecithin, manufactured by Fisher Scientific, in Isopar ®-H and 30 g of a 10 percent solution of OLOA ®-1200, manufactured by Chevron Chemicals, dissolved in Isopar ®-H.

The toning station consisted of a large cylindrical outer vessel with an open top and a conical bottom and a smaller inner cylindrical vessel with a closed top except for a narrow slit positioned just below and across the lower drum. The top of the inner vessel was polished and electrically biased and positioned above the top of the outer vessel. In operation, toner flowed from the bottom of the outer vessel and was pumped into the outer and inner vessels at entry ports near the bottom of each. Toner entering the inner vessel overflowed through the slit in the top with laminar flow and overflowed into the outer vessel.

Transfer was achieved using the bias roll technique. A high voltage of opposite polarity to that of the toner particles was applied to the upper drum. The voltage created an electric field which drove the particles off the photopolymer master onto the paper wrapped around the upper drum. Since the master and transfer drums were separated by a 3–5 mil spacing, transfer was purely electrostatic and almost no resolution loss occurred during the transfer process. The best images were obtained with 1500 volts on the transfer drum and a 4 mil spacing between the photopolymer surface and the paper. The experiments showed a 1–99% dot range toned on the master and a 1–97% dot range routinely transferred onto paper. Furthermore, images obtained from these samples with PMMA binder showed higher contrast between toned and untoned areas, much better shaped dots and well defined dot edges, as compared to images obtained with higher resistivity binders.

The image quality can be easily related to the electrical properties of the materials. For example best images are obtained for those samples with a ratio of exposed-/unexposed resistivity in the 100–500 range.

The resistivity of the polymer was measured in the following way. A gold electrode was first deposited on the photopolymer surface and the aluminized area between the photopolymer and the polyethylene terephthalate used as the back electrode. The resistivity was measured for samples of known area and coating thickness. A voltage was applied across the electrodes and an electrometer was connected in series with the sample. The electrometer allowed accurate measurement of extremely low currents. The resistivity is then calculated using the following formula:

$$\rho = R1/A = V1/IA$$

where V is the voltage applied between the electrodes, I is the measured current, 1 is the sample thickness and A is the area of the sample.

These measurements showed that the resistivity of the exposed material with the formulation described above was $1.9 \times 10^{15}$ ohm·cm. In contrast, a similar formulation in which the binder was polystyrene methylmethacrylate (PSMMA) showed instead a resistivity in the exposed areas of $5.1 \times 10^{16}$ ohm·cm.

The resistivity of the unexposed areas was obtained from measurements of discharge time. For these experiments two one inch diameter samples of unexposed material were placed in a Monroe model 276 rotating charging station interfaced to a Hewlett Packard computer for data acquisition. The samples were charged under a single wire corona and the voltage retained as a function of time measured with an electrostatic multimeter. The discharge curve gives a direct measure of the decay rate in the unexposed material. Discharge rates are, in turn, directly proportional to the resistivity with a proportionally constant of $e/4\pi$, where e is the dielectric constant and $\pi = 3.1428$. Results from these experiments showed that the resistivity of the unexposed photopolymer with PMMA binder was $1.0 \times 10^{12}$ ohm·cm and that of a similar formulation with PSMMA binder was $2.1 \times 10^{12}$ ohm·cm.

Using the procedure of this example, a 4-color overlay or surprint color proof can be prepared. Four masters are prepared, using four process-color (yellow, magenta, cyan, black) separation negatives of the same scene. Each master is charged then toned with the corresponding process-color toner to form a toner image. The image is transferred using the bias roll technique described, but to make an overlay clear polyethylene terephthalate (PET) film is substituted for the paper used in the example. Voltage on the metal core of the bias roll can be adjusted, e.g., from 200 to 1500 volts, and spacing between the paper or PET film surface and the photopolymer surface can be adjusted, to give optimum transfer efficiency for the particular toner used.

For making an overlay, each image is transferred to a separate piece of PET film. After transfer has been completed, the PET is placed in an oven of 100° C. for about 10-20 secs. Heating melts the polymer constituent of the toner particles, changing the appearance of the image from a dull to a glossy finish. This glossy appearance is necessary for the light to be transmitted through all four PET films when overlaid giving the balanced color of the final image.

For making a surprint, the four images are transferred sequentially to a single sheet of paper. A dielectric layer such as polyethylene terephthalate film wrapped around the metal core of the bias roll and underneath the paper permits use of voltage up to 3000 volts, and raising the voltage for each sequential transfer, which improves transfer efficiency.

Although the process of this invention has been described in connection with the use of photopolymerizable systems containing binder, ethylenically unsaturated monomer, 2-O-substituted HABI and chain transfer agent, any photopolymerizable system which will provide the desired electrical characteristics described above can be used. For example, a system containing $CBr_4$ or $CHCl_3$ as photopolymerization initiator can be used with a leuco dye and an N-vinyl carbazole monomer. Other initiators which can be used include Michler's ketone, alone or in combination with camphorquinone, and new methylene blue/dimedone. A crosslinkable Formvar® 7-70 polyvinyl formal layer containing 20 weight percent, 9,10-phenanthrenequinone can be used. The system described in Alles U.S. Pat. No. 3,458,311, incorporated herein by reference, can also be used. However the HABI-initiated systems described herein are preferred because of photospeed electrical characteristics, image quality, Isopar® stability, and storage stability.

We claim:

1. A xeroprinting process which utilizes a suspension of electrostatically charged toner particles in a dispersant liquid to develop an oppositely-charged electrostatic image on a photopolymer master and which comprises the steps:
   (1) imagewise exposing to actinic radiation an electrostatic photopolymer master having a photopolymerizable resistivity in exposed areas of the layer;
   (2) without removing unexposed areas of the layer, charging the master by corona discharge while on a conductive support to form a latent image of electrostatic charge on the exposed areas;
   (3) developing the image by applying to both exposed and unexposed areas of the master the suspension of oppositely charged electrostatic toner particles; and
   (4) transferring the toner image to another surface.

2. Improved process of claim 1 wherein steps (2), (3) and (4) are repeated to produce multiple copies with a single exposure.

3. Process of claim 2 wherein the photosensitive layer consists essentially of a polymeric binder, an ethylenically unsaturated photopolymerizable monomer, a 2-o-substituted hexaarylbiimidazole photoinitiator, and a chain transfer agent.

4. Process of claim 3 wherein the resistivity of the monomer is $10^5$ to $10^9$ ohm·cm and the resistivity of the binder is $10^{14}$ to $10^{20}$ ohm·cm.

5. Process of claim 4 wherein the resistivity of the binder is $10^{14}$ to $10^{16}$ ohm·cm.

6. Process of claim 4 wherein the resistivity of the binder is $10^{18}$ to $10^{20}$ ohm·cm.

7. Process of claim 4 wherein the initiator is a 2-o-substituted hexaphenylbiimidazole and the monomer is a di-, tri- or tetraacrylate.

8. Process of claim 7 wherein the binder is poly(styrene/methylmethacrylate) or poly(methylmethacrylate), the monomer is ethoxylated trimethylolpropane triacrylate or polyethylene glycol dimethacrylate, the initiator is 2,2',4,4'-tetrakis(o-chlorophenyl)-5,5'-bis(m,p-dimethoxyphenyl)-biimidazole or 2,2'-bis(o-chlorophenyl)-4,4',5,5'-tetraphenylbiimidazole and the chain transfer agent is 2-mercaptobenzoxazole or 2-mercaptobenzthiazole.

9. Process of claim 8 wherein the chain transfer agent is 2-mercaptobenzoxazole.

10. Process of claim 9 wherein the binder is poly(styrene/methylmethacrylate).

11. Process of claim 9 wherein the binder is polymethylmethacrylate and the process provides a dot range of at least 1 to 97% in the transferred image when exposure is through a 150 line halftone negative.

12. Process of claim 10 wherein the monomer is ethoxylated trimethylol propane triacrylate.

13. Process of claim 11 wherein the monomer is ethoxylated trimethylol propane triacrylate.

14. Process of claim 3 wherein exposure is made through a process-color separation halftone negative, the charged master is toned with the corresponding process-color toner, and the toner image is transferred to transparent polymeric film or paper, to provide one layer of a 4-color overlay or surprint color proof.

15. Process of claim 14 wherein a 4-color surprint on paper is prepared by exposing, charging and toning four masters and the toner image from each master is transferred to the same paper surface.

16. Process of claim 4 wherein the photoinitiator concentration is 10 to 30% by weight based on the weight of the photosensitive layer, the chain transfer agent is 2-mercaptobenzoxazole or 2-mercaptobenzthiazole, and both the photoinitiator and chain transfer agent are substantially free of components removable by recrystallization from a methylene chloride and methanol mixture.

17. Process of claim 16 wherein the imagewise exposure is digital exposure by means of a modulated laser beam.

18. Process of claim 1 wherein prior to exposure a film comprising the photopolymerizable layer on a release layer is laminated to the conductive support with the photopolymerizable layer adjacent the support, and the release layer is removed prior to charging.

19. Process of claim 18 wherein the release layer is polyethylene or polypropylene.

20. Process of claim 8 wherein the toner is a suspension of toner particles in a branched chain aliphatic hydrocarbon liquid.

21. Process of claim 12 wherein the toner is a suspension of toner particles in a branched chain aliphatic hydrocarbon liquid.

22. Process of claim 13 wherein the toner is a suspension of toner particles in a branched chain aliphatic hydrocarbon liquid.

* * * * *